United States Patent [19]
Gates

[11] Patent Number: 5,844,777
[45] Date of Patent: Dec. 1, 1998

[54] APPARATUS FOR HEAT REMOVAL FROM A PC CARD ARRAY

[75] Inventor: Frank Vernon Gates, Township of Roxybury, Morris County, N.J.

[73] Assignee: AT&T Corp., Middletown, N.J.

[21] Appl. No.: 789,444

[22] Filed: Jan. 27, 1997

[51] Int. Cl.$^6$ ..................................................... H05K 7/20
[52] U.S. Cl. ........................ 361/700; 165/80.4; 165/185; 174/15.2; 174/16.3; 361/690; 361/704
[58] Field of Search .............................. 165/80.4, 104.33; 174/15.2, 16.3; 361/688–697, 700–704, 715, 719, 720, 737, 796

[56] References Cited

U.S. PATENT DOCUMENTS

| | | |
|---|---|---|
| 4,019,098 | 4/1977 | McCready et al. . |
| 4,449,576 | 5/1984 | Baum et al. . |
| 4,777,561 | 10/1988 | Murphy et al. .......................... 361/700 |
| 4,884,167 | 11/1989 | Mine . |
| 4,949,164 | 8/1990 | Ohashi et al. . |
| 4,962,444 | 10/1990 | Nissemann .............................. 165/80.4 |
| 5,019,939 | 5/1991 | Reimer ..................................... 361/699 |
| 5,057,968 | 10/1991 | Morrison ................................. 361/700 |
| 5,329,425 | 7/1994 | Leyssens et al. ........................ 361/701 |
| 5,339,214 | 8/1994 | Nelson . |
| 5,388,635 | 2/1995 | Gruber et al. . |
| 5,424,916 | 6/1995 | Martin ..................................... 361/796 |
| 5,471,850 | 12/1995 | Cowans . |

*Primary Examiner*—Gregory D. Thompson

[57] ABSTRACT

An apparatus for cooling an array of PC cards includes a chassis defining a chamber having air holes. A heat sink is mounted to the chassis within the chamber and has a finned surface for transferring heat to the surrounding environment, a finless surface on a side opposite the finned surface, and heat pipes fully enclosed within the heat sink, facilitating conductive heat transfer between the finned and finless surfaces. A backplane mounted to the chassis has at least one connector mechanically and electrically connectable to at least one PC card so that a surface of the at least one PC card is in close proximity to and substantially parallel to the finless surface of the heat sink thus facilitating heat transfer between the at least one PC card and the heat sink.

16 Claims, 2 Drawing Sheets

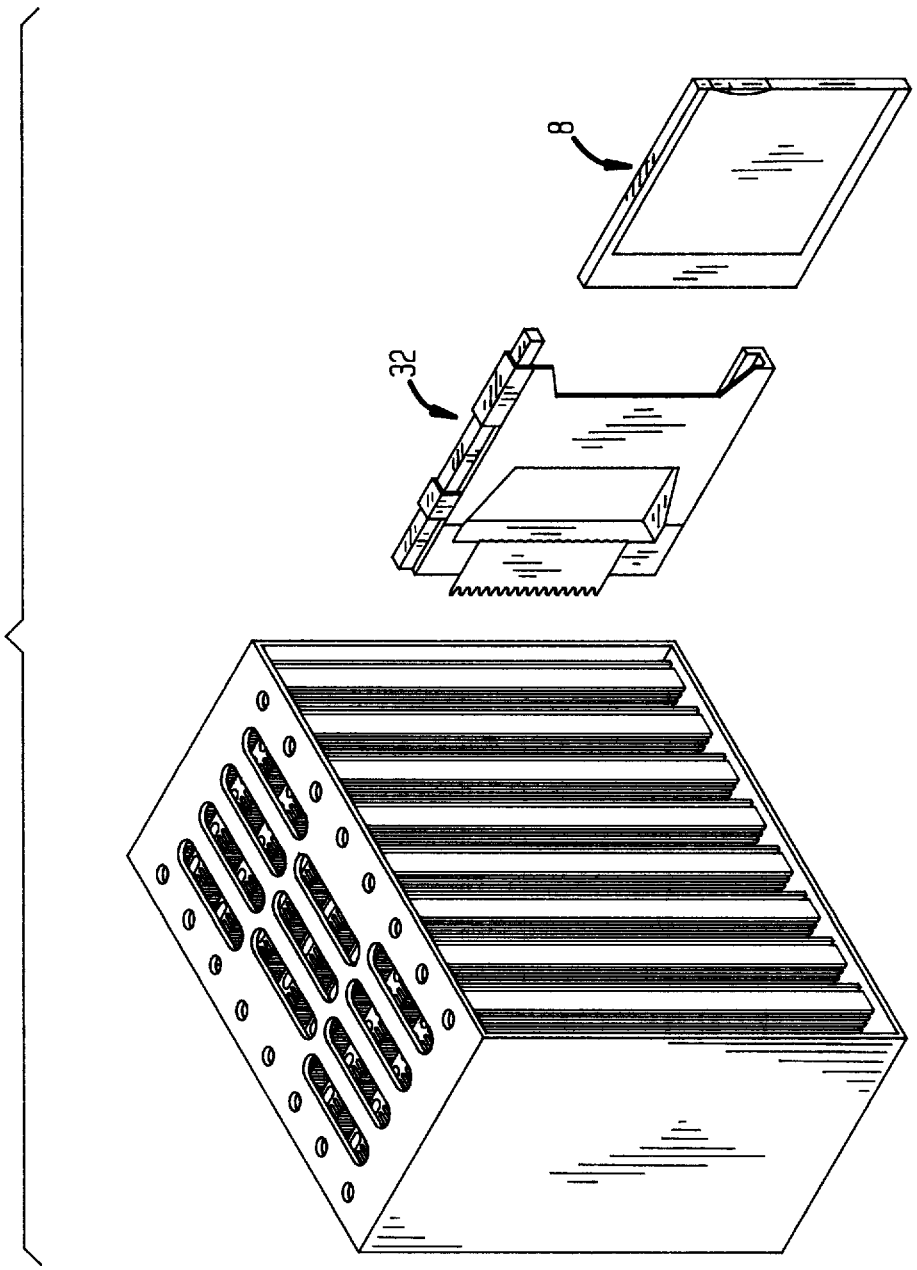

APPARATUS FOR HEAT REMOVAL FROM A PC CARD ARRAY

FIELD OF THE INVENTION

The invention relates to the removal of heat from a PC card array, and specifically to the use of heat sinks, with embedded heat pipes, to define slots for the insertion of PC cards and to remove heat efficiently from the inserted PC cards.

BACKGROUND OF THE INVENTION

PC cards, for example those that conform to the PCMCIA standard, are small printed circuit boards having electronic components on them. Typically, a PC card includes all of the components required to implement a given electronic function, an example being a fax/modem function. PC cards are used extensively in laptop personal computer and other applications and are useful because of their small size, durability, and ease of insertion into and extraction from various machines. PC cards are particularly durable when encased in a metal shell. However, one disadvantage of PC cards is that because they are small and enclosed, they are limited in the amount of heat that they can dissipate. Retained heat in PC cards causes the temperature of the PC cards and electronic components thereon to rise, leading to permanent damage or failure above a certain temperature.

PC cards would be applicable to a wider variety of uses if they were stacked in multiple card arrays and if heat could be removed from the multiple card arrays effectively. Multiple card arrays have been implemented with sheet metal dividers or cages defining slots for insertion of PC cards. This technique suffers from inefficiency in removing heat generated by the electronic components of the PC cards during normal operation. Another technique implements an array for holding PC cards with a plurality of cold plates defining slots for PC cards. Connected by springs to the cold plates are pistons which make contact to heat generating components on the PC cards, thus facilitating the transfer of heat from the PC card to the cold plate. The cold plate is kept cold with internal pipes containing a fluid, held in a vacuum, fluidly connected to a refrigeration unit via external piping. This apparatus has the disadvantage of requiring special procedures to displace the pistons for insertion of the PC cards. In addition, the requirement of an external refrigeration source adds expense and bulk to the apparatus.

Other apparatuses for cooling printed circuit boards (PCBs) rely on bonding heat sinks to the PCB or components thereon. These apparatuses are undesirable for PC cards because bonding the heat sink to the PC card undermines the small size and machine-to-machine portability advantages of the PC card. In addition, once bonded, the heat sink limits the range of applications for which the attached PC card is adapted.

SUMMARY OF THE INVENTION

In order to overcome the above identified disadvantages, an inexpensive apparatus for removing heat from a PC card array is disclosed. The apparatus is adapted to facilitate insertion and extraction of PC cards, does not require fluid connection to a refrigeration unit or physical contact with the heat sink, and is relatively inexpensive to manufacture.

The apparatus includes a chassis defining a chamber having air holes. A heat sink is mounted to the chassis within the chamber. The heat sink has a finned surface for transferring heat to an environment surrounding the heat sink, an unfinned surface on a side opposite the finned surface, and heat pipes fully enclosed within the heat sink that facilitate conductive heat transfer within the heat sink thus rendering convection heat transfer from the heat sink to the surrounding environment more efficient. A backplane mounted to the chassis has at least one electrical connector mechanically and electrically connectable to at least one PC card so that a surface of the at least one PC card is in close proximity to and substantially parallel to the unfinned surface of the heat sink thus facilitating heat transfer between at least one PC card and the heat sink.

BRIEF DESCRIPTION OF THE DRAWINGS

These and other objects, features, and advantages will be more fully appreciated with reference to the accompanying drawings.

FIG. 2 is a view of the invention illustrating the manner of connection of a PC card to the apparatus.

DETAILED DESCRIPTION OF THE INVENTION

Figure 1:
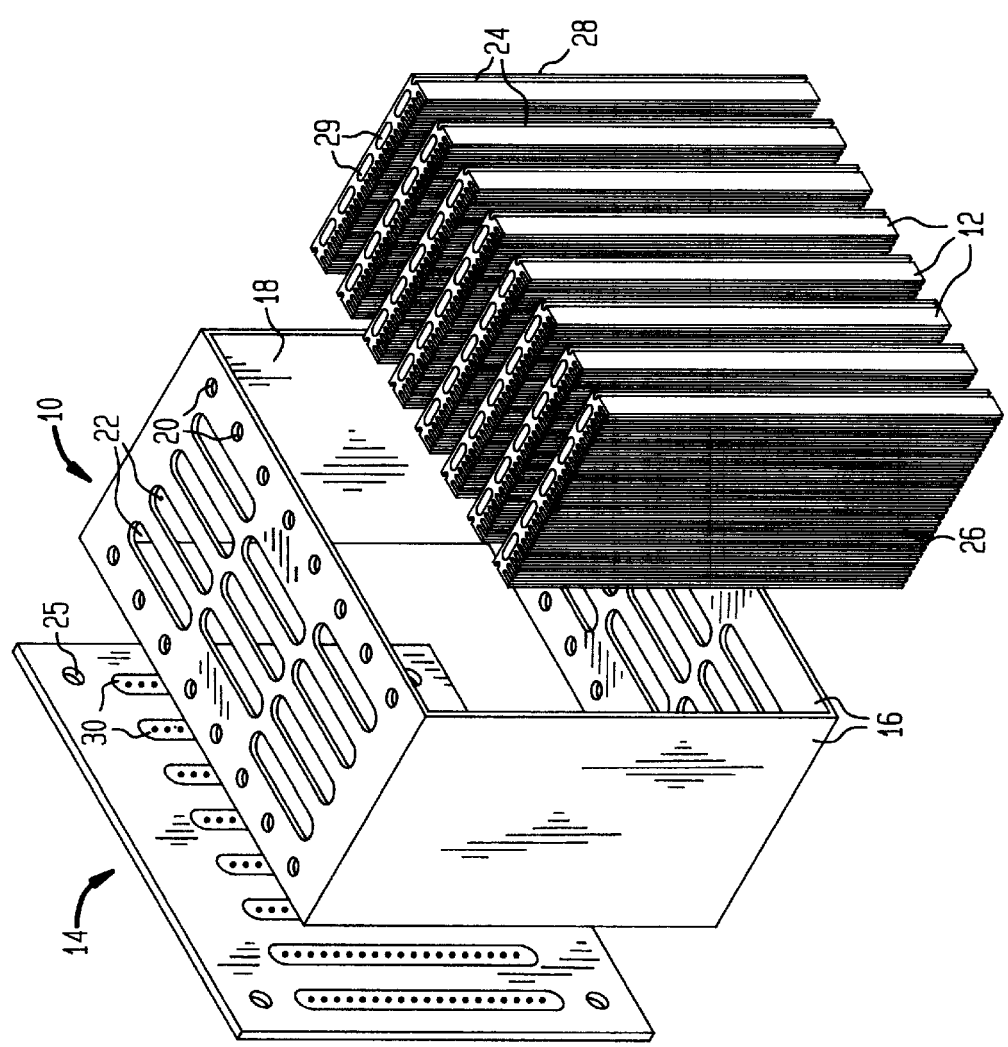
FIG. 1 is an exploded view of a preferred embodiment of the present invention illustrating its component parts.

FIGS. 1 and 2 depict a preferred embodiment of an apparatus for holding and removing heat from one or more PC cards 8 according to the present invention. The apparatus includes a chassis 10, one or more heat sinks 12, and a backplane 14.

The chassis 10 has four rectangular sidewalls 16 substantially perpendicular to each other defining an interior chamber 18 having two open ends opposite each other as shown in FIG. 1. Two of the sidewalls 16 of the chassis 10 include a plurality of screw holes 20 and air holes 22. The screw holes 20 are used to mount one or more heat sinks 12, through mating screw holes 24 on the heats sinks, to the chassis 10 with screws (not shown) at regular intervals. However, the heat sinks 12 may be mounted to the chassis 10 by other techniques including by welding, gluing, and clamping. The air holes 22 expose the interior chamber 18 to the environment outside of the chassis. In a preferred embodiment, air enters the interior chamber 18 through the air holes 22 and flows over the heat sinks 12 thus cooling them. However, in an alternate embodiment of the invention, the environment to which the interior chamber 18 is exposed may be a gas other than air, for example nitrogen, or may be a liquid. The heat sinks 12 have a finned surface 26 and an unfinned surface 28. Preferably, the heat sinks 12 are mounted so that the finned surfaces 26 all point in the same direction, and so that the space between the respective finned and unfinned surfaces of adjacent heat sinks 12 defines a slot for insertion of one or more PC cards 8.

The backplane 14 is adapted for receiving PC cards 8, and is mounted to the chassis 10 at an open end. Mounting may be accomplished by screwing the backplane 14 to the sidewalls 16 of the chassis 10 through screw holes 25 on the backplane 14. Alternatively the backplane 14 may be mounted to the chassis 10 by techniques including welding, gluing, and clamping. Spaced at intervals along the backplane 14 are receptacles 30, each of which receives a mating end of a PC card 8 which may be plugged into the receptacle 30. The receptacles 30 may be implemented as electrical connectors which both electrically and mechanically couple each PC card 8 to the backplane 14. Furthermore, the backplane 14 includes electrical wiring which routes power, ground and signals to and between PC cards 8 of the system.

The spacing interval of the receptacles 30 along the backplane 14 is chosen so that each receptacle 30 is located in the slot defined by the space between adjacent heat sinks 12. Thus, as shown in FIG. 2, a PC card 8 may be plugged into the backplane 14 between the heat sinks 12 from the open end of the chassis 10 opposite the backplane 14. The PC cards 8 must be substantially planar. In a preferred embodiment, the PC cards 8 further include a housing 32 that plugs into and is securely held by a receptacle 30 on the backplane 14. The PC cards 8 then plug into the housing 32 thus electrically and mechanically connecting the PC card 8 to the backplane 14 via the housing 32. The offset of the receptacle 30 relative to the heat sinks 12 is ideally placed such that each PC card 8 may be easily inserted between the heat sinks 12 and is held substantially parallel and close to the unfinned surface 28 of each heat sink 12. In a preferred embodiment, the PC cards 8 do not make physical contact with the heat sinks 12. However, in an alternate embodiment, the PC cards 8 do make physical contact with the heat sinks 12.

The heat sinks 12 are substantially planar and include a finned surface 26 and an unfinned surface 28. The unfinned surface 28 is substantially smooth. The finned surface 26 has a plurality of substantially parallel fins which extend lengthwise from one end of the heat sink 12 to the other. Embedded between the finned surface 26 and the unfinned surface 28 of the heat sink 12 are a plurality of heat pipes 29, which extend lengthwise and substantially parallel to each other. Heat pipes enhance heat transfer by virtue of the encased fluid boiling. The heat pipes 29 are hollow passages that hold fluid, for example water or methanol, which upon boiling greatly enhances heat transfer within the heat pipes 29. Each heat pipe 29 is usually in a vacuum so that the boiling occurs at low temperatures and essentially acts as a passive cooling device with no moving parts. The heat pipes 29 also facilitate heat transfer along the length and width axes of the heat sink 12 itself. In a preferred embodiment, the heat pipes 29 are evacuated after manufacture of the heat sink 12, filled with the fluid, and sealed thus fully enclosing the fluid within each of the heat pipes 29 within each heat sink 12.

An advantage of the heat sink 12 according to the present invention is that the heat sink 12 may be manufactured using inexpensive techniques including extrusion because the fins and the heat pipes 29 are substantially parallel to one dimension. In a preferred embodiment of the invention, the heat sink 12 is made of extruded aluminum, is 3.5 inches in width and 5 inches in length, and has two screw holes 24 which extend the length of the heat sink 12 as shown in FIG. 1. However, other materials may be used to implement the heat sink 12. Also, other metals including copper and alloyed metals are suitable for use as long as the material's thermal resistance is low.

In use, one or more PC cards 8 is inserted into the chassis 10 between adjacent heat sinks 12 and is mechanically and electrically connected through the receptacles 30 to the backplane 14. Each connected PC card 8 then performs intended functions. As a byproduct of operation, heat is generated by the electronic components in each PC card 8 which tends to raise its temperature.

Heat from the operation of each PC card 8 is transferred to the unfinned surface 28 of the adjacent heat sink 12 by conduction and radiation. When the PC card 8 does not touch the unfinned surface 28 of the heat sink 12, heat is transferred from the PC card 8 to the heat sink 12 by conduction across the air gap between the PC card 8 and the unfinned surface 28 of the heat sink 12. Additionally, heat is radiated across the air gap from the PC card 8 to the unfinned surface 28 of the heat sink 12. In order to increase the efficiency of heat transfer by radiation, the optical properties of the unfinned surface 28 can be modified. For example, painting an aluminum heat sink 12 with black paint increases its surface emissivity from about 0.1 to about 0.9 and therefore greatly enhances the efficiency of heat transfer by radiation.

Alternatively, if the PC card 8 contacts the unfinned surface 28 of the heat sink 12 in whole or in part, the above two transfer mechanisms are combined with heat conduction directly from the exterior of the PC card 8 to unfinned surface 28 of the heat sink 12.

The heat sink 12 continuously exchanges heat with the surrounding air in the interior chamber 18 of the chassis 10 over the entire surface area of the heat sink 12. Most heat is exchanged between the heat sink 12 and the surrounding air at the finned surface 26 because the finned surface 26 presents the most surface area to the surrounding air. The air holes 22 in the chassis 10 facilitate entry of cool air to displace heated air surrounding the heat sinks 12 in the chassis 10. Within the heat sink 12 itself, the heat pipes 29 tend to significantly reduce the resistance to the flow of heat, thus spreading heat more evenly over the surface area of the heat sink 12 for dissipation. This is extremely important, particularly where fans are not used to force air over the heat sink 12. In this latter scenario, PC cards 8 in the middle of the chassis 10 will be at maximum distance from the air holes 22. The low thermal resistance provided by the heat pipes 29 greatly increases the cooling efficiency of the apparatus and specifically enhances the ability to cool middle situated PC cards 8. Further cooling efficiency may be gained by implementing a fan to force air over the finned surface 26 of the heat sinks 12.

Although specific embodiments have been disclosed, it will be understood by those having ordinary skill in the art that changes may be made without departing from the spirit and scope of the invention.

What is claimed is:

1. An apparatus for removing heat from at least one PC card comprising:
   a chassis defining a chamber having air holes;
   a heat sink mounted to the chassis within the chamber, the heat sink having a finned surface for transferring heat to an environment surrounding the heat sink, a finless surface on a side opposite the finned surface, and heat pipes fully enclosed within the heat sink, the heat pipes facilitating conductive heat transfer between the finned and finless surfaces; and
   a backplane mounted to the chassis having at least one electrical connector mechanically and electrically connectable to at least one PC card so that a surface of the at least one PC card is in close proximity to and substantially parallel to the finless surface of the heat sink facilitating heat transfer between the at least one PC card and the heat sink.

2. The apparatus according to claim 1,
   wherein a plurality of heat sinks are mounted at intervals to the chassis within the chamber with a space between respective finned and finless surfaces of adjacent heat sinks defining a slot; and
   wherein the at least one electrical connector is situated on the backplane between each slot.

3. The apparatus according to claim 1, wherein the finless surface of the heat sink is treated to improve radiative heat transfer between the PC card and the heat sink.

4. The apparatus according to claim 3, wherein the treated, finless surface has a surface emissivity of about 0.9.

5. The apparatus according to claim 3, wherein the heat sink is treated with black paint.

6. The apparatus according to claim 1, wherein the heat sink is made from extruded material.

7. The apparatus according to claim 6, wherein the material is metal.

8. The apparatus according to claim 7, wherein the metal is aluminum.

9. The apparatus according to claim 7, wherein the metal is copper.

10. The apparatus according to claim 6, wherein the material is a metal alloy.

11. The apparatus according to claim 1, wherein upon connection of one of the at least PC card to one of the at least one electrical connector, a surface of the connected PC card physically contacts the finless surface of the heat sink.

12. A method of cooling a stack of PC cards, comprising the steps of:

providing a chassis;

providing heat sinks, each heat sink having a finned and a finless surface and fully enclosed heat pipes;

coupling the heat sinks to the chassis with a space between adjacent heat sinks, the space defining slots for insertion of PC cards;

providing electrical connectors on a backplane coupled to the chassis, each electrical connector being disposed within one of the slots;

coupling each PC card to one of the electrical connectors, each PC card being situated in close proximity to the finless surface of each heat sink so that heat is transferred from each PC card to each heat sink; and cooling each heat sink by allowing air to flow over the finned surface of each heat sink.

13. The method according to claim 12, wherein each PC card touches the finless surface of one of the heat sinks.

14. The method according to claim 12, wherein each heat sink is made by extruding metal.

15. The method according to claim 14, wherein the metal is aluminum.

16. The method according to claim 14, wherein the metal is copper.

* * * * *